United States Patent
Rapoport et al.

(10) Patent No.: US 7,315,168 B2
(45) Date of Patent: Jan. 1, 2008

(54) SHIMMING WITH MRI GRADIENT

(76) Inventors: Uri Rapoport, 17 Moshav, Ben Shemen, 73115 (IL); Ehud Katznelson, 18B Hayasmin St., Ramat Yishay, 30095 (IL)

( * ) Notice: Subject to any disclaimer, the term of this patent is extended or adjusted under 35 U.S.C. 154(b) by 0 days.

(21) Appl. No.: 11/296,567

(22) Filed: Dec. 8, 2005

(65) Prior Publication Data

US 2007/0132455 A1    Jun. 14, 2007

(51) Int. Cl.
*G01V 3/00*    (2006.01)
(52) U.S. Cl. .................... 324/320
(58) Field of Classification Search ........ 324/300–322; 600/410–435; 335/396–306
See application file for complete search history.

(56) References Cited

U.S. PATENT DOCUMENTS

| | | | |
|---|---|---|---|
| 4,899,109 A * | 2/1990 | Tropp et al. | 324/320 |
| 4,931,733 A * | 6/1990 | Hanawa | 324/318 |
| 5,343,151 A * | 8/1994 | Cory et al. | 324/320 |
| 5,539,316 A * | 7/1996 | Sukumar | 324/320 |
| 5,760,585 A * | 6/1998 | Dorri | 324/320 |
| 6,687,526 B2 * | 2/2004 | Brand et al. | 600/410 |
| 7,034,530 B2 * | 4/2006 | Ahluwalia et al. | 324/309 |

FOREIGN PATENT DOCUMENTS

GB    2378763    2/2003

* cited by examiner

*Primary Examiner*—Brij Shrimarinov
*Assistant Examiner*—Dixomara Vargas
(74) *Attorney, Agent, or Firm*—AlphaPatent Associates Ltd.; Daniel J. Swirsky

(57) ABSTRACT

A method of correcting active shimming element of a magnetic resonance device, including providing a set of correction values for each shimming element for a given N sub volumes, wherein N is an integer number greater than or equal to 1, detecting irregularities in the magnetic field of the sample regions, optimizing all the shimming elements according to the set of correction values, assessing the regularity of the corrected magnetic field, and reiterating the process until field uniformity is achieved, such that an accurate magnetic resonance measurement of the sample is achieved after a minimum number of iterations.

17 Claims, 4 Drawing Sheets

SHIMMING WITH MRI GRADIENT

FIELD OF INVENTION

The present invention generally relates to a method of calibrating the shim coils of a magnetic resonance device.

BACKGROUND OF THE INVENTION

A magnetic resonance imaging device produces a measurement of a sample which is based upon its molecular structure. The sample is subjected to a polarizing magnetic field which has the effect of aligning the spins of all the atomic nuclei of the sample. Radio waves at a frequency close to the Lamor frequency of the nuclei are then used to excite the nuclei such that their magnetic alignment is reversed. Once the excitation is removed the nuclei return to their original state by emitting characteristic radio signals. It is these radio signals that can be used to image the sample.

The exact Lamor frequency is dependent upon the precise magnetic field. By creating a magnetic field gradient within the sample cavity the source of these signals can be located such that an overall image of the sample can be constructed.

The efficiency of this process depends upon the consistency of the magnetic field strength within the sample cavity. This field is typically controlled to within 5 parts per million. The extent of the uniformity of the magnetic field determines the accuracy with which the Lamor frequency can be measured. This allows for the resolution of smaller chemical shifts.

Uniformity of magnetic fields to less than 5 ppm is very difficult to achieve over a large volume. In order to overcome fluctuations in the permanent magnetic field produced by a surrounding magnetic circuit, a variety of shimming methods may be used, such as the inclusion of ferromagnetic material of specific shapes at specific locations for example as described in patent no. GB 2,378,763 or the use of oddly shaped shimming coils whose magnetic fields can be adjusted by controlling the current passing through them.

In order to superimpose a magnetic field gradient onto the uniform magnetic field in the sample cavity, additional gradient coils are used. The higher the magnetic gradient that can be produced by the gradient coils, the higher the resolution of the image acquired, however in order for the gradient to cover the whole sample cavity requires a large coil.

A uniform magnetic field can be achieved by the methods described above, however maintaining its uniformity in a fluctuating environment requires a dynamic shimming mechanism. For example, in an industrial setting where, say, a high temperature liquid sample is being measured and the magnetic permittivity of sample may be temperature dependent, the magnetic field characteristics around the sample will change over time. In this environment it is necessary to use a dynamic shimming mechanism which is able to respond quickly to changes in the sample environment.

There is thus a long felt need in the art for a method of correcting the shimming elements of a magnetic resonance device in real time so as to counter deviations in the magnetic field around the sample.

SUMMARY OF THE INVENTION

It is therefore one object of the present invention to present a method of correcting active shimming element of a magnetic resonance device. Said method comprising steps selected in a non-limiting manner from a group comprising: providing a set of correction values for each shimming element for given N sub volumes, wherein N is an integer number equal or higher then 1; detecting irregularities in the magnetic field of the sample regions; optimizing all the shimming elements according to said set of correction values; assessing the regularity of the corrected magnetic field; and reiterating the process until a pre defined field uniformity is achieved; such that an accurate magnetic resonance measurement of the sample is achieved after a minimum number of iterations.

The aforesaid method may additionally comprise a step or steps for detecting irregularities in the magnetic field of the sample sub region by comparing the line shape of the response with the line shape of at least one reference standard. It may additionally or alternatively comprise a step of a plurality of steps of calibrating, useful for producing a set of correction values. This method hence comprises measuring the line shape of a magnetic resonance measurement in homogeneous magnetic field of the N sub volumes; shimming the magnet until the shape of the response line is approximately of homogeneous magnet; recording this line shape as a reference standard; producing a set of correction values for a particular shim coil; performing a magnetic resonance measurement in one or more of the N sub volumes; recording the line shape produced in the non-uniform field in said N sub volume for a given shim coil; calculating the deviation from said reference standard; recording the correction values of each shimming element for a given deviation; thereby producing a correction value for each shimming element to be applied in order to correct a given line shape deviation, such that a reference table is produced providing correction values of each shimming element for a sample of line shape deviations in each sub volume.

It is further in the scope of the present invention to disclose a method of correcting the shimming elements of a magnetic resonance device, by applying in timing. Said timing is preferably selected from a group, comprising periodically, a response of a changing of one or more measuring parameters, initiated manner, predetermined manner, upon measuring the line shape and comparing it to a standard such that if the deviation in larger then a predetermined value, such that the magnetic resonance system automatically applied the process as defined in method as defined in any of the above.

The aforesaid method may additionally or alternatively comprise a step or steps of optimizing said correction currents to the shimming coils such that the total energy consumption is minimized. It may additionally comprise applying correction potentials across the shimming coils, and/or a step or more of optimizing the geometry or composition, orientation, strength of the set of shimming coil, for example introducing additional shimming elements.

The method may additionally comprise monitoring the line shape of magnetic resonance measurements at periodical or predetermined time intervals. It may additionally or alternatively comprise monitoring the line shape of magnetic resonance measurements following each measurement of the sample, and/or monitoring the line shape of magnetic resonance measurements whenever the line shape deviation of the magnetic resonance measurements of the sample increase above a predetermined value.

Another object of the present invention is to disclose a cost-effective minimum cycle shimming system for a magnetic resonance device. This system comprises in a non-limiting manner one or more of the following modules as follows: a magnetic resonance device, comprising inter alia a magnetic circuit constructed from strong permanent magnets; an adjustable shimming mechanism; at least one gradient coil enabling localizing measurement, said coil is provided by current selected from either a DC power supply, a pulsing power supply or any combination thereof; a contained cavity into which at least one sample is introduced and measured; at least one magnetic resonance measurement probe; and, a plurality of a predetermined and not coincident N sub volumes; at least one reference table of correction values for each of said sub volumes; at least one reference standard magnetic resonance measurement line shape; and a means, e.g. at least one processor, for calculating the line shape deviation of a magnetic resonance measurement and applying corrections to each shimming element according to each of said reference table of correction values. The uniformity of the magnetic field around said sample is monitored and restored following any variation, such as temperature change, effecting the magnetic field around the sample.

The system defined above may additionally comprise at least one sensor useful for measuring parameters selected from a group comprising temperature, flow rate, pressure, any other changes in the surrounding that may effect the magnet homogeneity or a combination thereof. It may additionally or alternatively comprise a means for stopping the flow to a predetermined time for measuring said sample.

The said system may further comprise shimming elements selected from active shimming coils, passive ferromagnetic pieces or any combination thereof. The adjustable shimming mechanism possibly comprises a plurality of sets of shim coils particularly adapted to correct inhomogenous magnetic field. Moreover, it may additionally comprise a means of varying the current supplied to the shimming coils, and/or a means of varying the potential applied across the shimming coils.

It is also in the scope of the present invention wherein the aforesaid system additionally comprises a means of altering the shape of the shimming coils; changing the position of the shimming elements such as tracks, mechanical arms or any other means; varying the number of shimming elements to the system as required or a combination hereof. The said system may further adapted to measure in at least one sub volume of said predetermined plurality of N sub volumes.

BRIEF DESCRIPTION OF THE FIGURES

In order to understand the invention and to see how it may be implemented in practice, few preferred embodiments will now be described, by way of non-limiting example only, with reference to the accompanying drawing, in which.

DETAILED DESCRIPTION OF THE EMBODIMENTS

Figure 1:
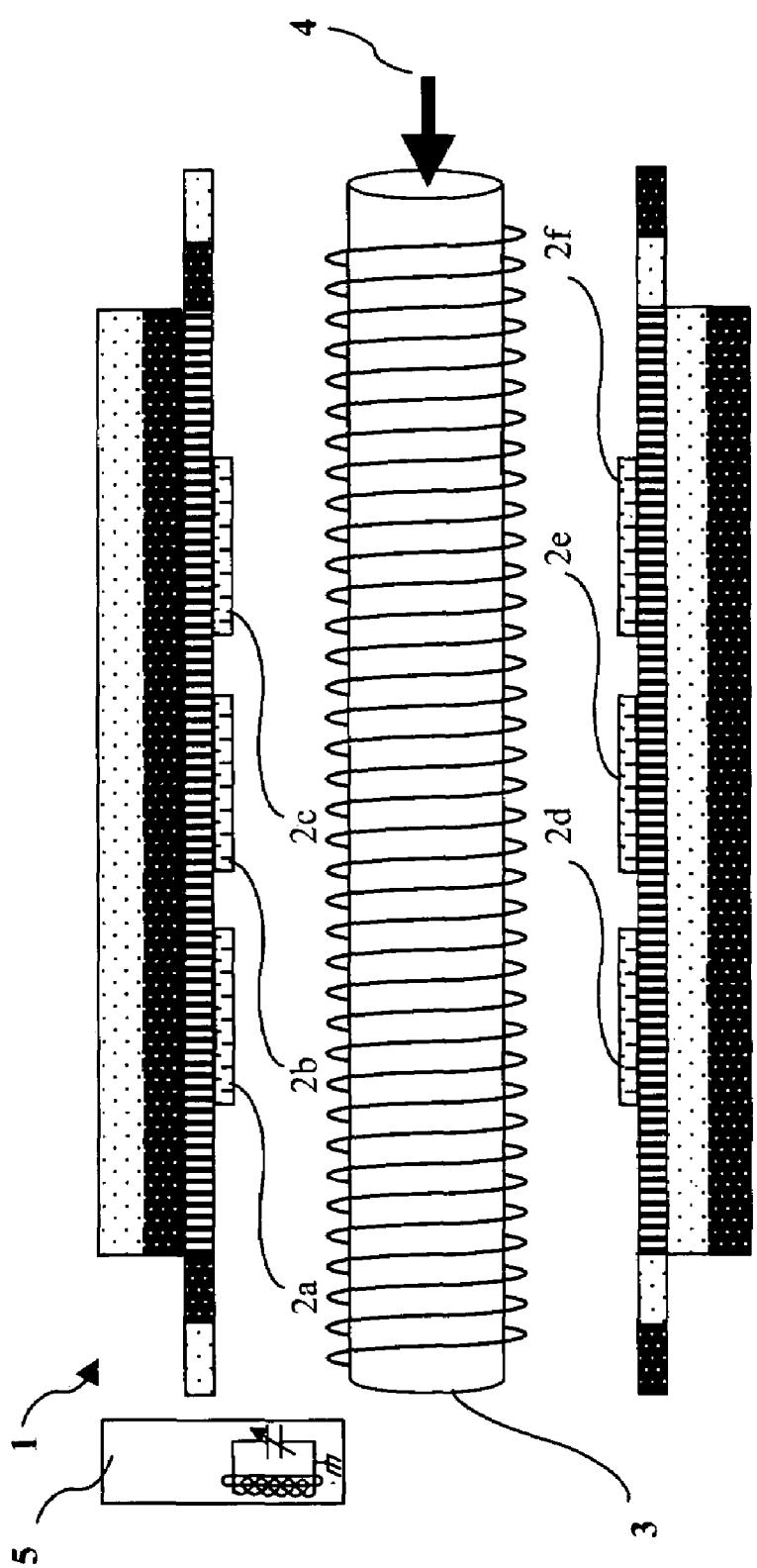
FIG. 1 schematically represents the minimum cycle magnetic resonance measurement unit according to one embodiment of the present invention.

The following description is provided, alongside all chapters of the present invention, so as to enable any person skilled in the art to make use of said invention and sets forth the best modes contemplated by the inventor of carrying out this invention. Various modifications, however, will remain apparent to those skilled in the art, since the generic principles of the present invention have been defined specifically to a method of calibrating the shim coils of a magnetic resonance and to a device providing the same.

The term 'correction value' applies hereinafter to any parameter that effects the magnetic field around a shimming element such that the magnetic field around a sample is restored to uniformity following a disruption. Such a parameter could be the current through the coil, voltage across the coil, shape of the coil, or any other parameter.

The term 'correction-current' applies hereinafter to the size of the current applied to a shim coil such that the magnetic field around a sample is restored to uniformity following a disruption.

The term 'line shape' applies hereinafter to the shape of the response line produced when the amplitude of the response signal is plotted against the frequency of the signal.

The term 'reference standard' applies hereinafter to the line shape achieved after shimming manually for a reference nucleus such as deuterium.

The term 'Gaussian' applies hereinafter to a bell shaped distribution.

The term 'line shape deviation' applies hereinafter to the difference between the measured line shape and the reference standard.

The term 'correction database' applies hereinafter to a set of reference tables each associated with a unique line shape and containing a set of correction values for each shimming element.

The term 'sample cavity' applies hereinafter to a cavity within a containing envelope within which a sample is introduced.

The term 'magnetic circuit' applies hereinafter to the path of magnetic flux from north to south magnetic poles.

The term 'shimming mechanism' applies hereinafter to any mechanism for correcting the inhomogeneities of a magnetic field due to imperfections in the magnet or the presence of external ferromagnetic objects. A shimming mechanism may include, inter alia, passive shimming elements, active shimming elements, feedback controlled shimming, processor controlled shimming, superconducting shimming elements.

The term 'shimming elements' applies hereinafter to any element introduced into the magnetic circuit in order to correct inhomogeneities of the magnetic field.

The term 'shim coils' or "active shimming elements" applies hereinafter to coils positioned around the magnets in order to correct any inhomogeneities of the magnetic field.

The term 'passive shimming elements' applies hereinafter to pieces of ferromagnetic material or hard magnetic material positioned around the magnets in order to correct inhomogeneities of the magnetic field.

The term 'gradient coil' applies hereinafter to a coil used to create a magnetic gradient at least in one direction and that can be used for localized measurement of the sample cavity.

The term 'magnetic resonance sensing probe' applies hereinafter to the element of the magnetic resonance device adapted to emit and receive electromagnetic signals emitted from excited nuclei within the sample.

The term 'plurality' applies hereinafter to any integer number greater than or equal to one.

The term 'automated correction program' applies hereinafter to an algorithm or any other procedure, particularly one controlled by a computer especially when adapted so as to effect corrections to the shimming elements.

It is according to one embodiment of the current invention to present a method of correcting the shimming elements of a magnetic resonance device by providing a set of correction values for each shimming element, for a given N sub volumes, wherein N is an integer number greater than or equal to 1, detecting irregularities in the magnetic field of the sample region and correcting all the shimming elements according to said set of correction values, then the corrected magnetic field is assessed and if necessary reiterating the process until field uniformity is achieved such that an accurate magnetic resonance measurement of the sample is achieved after a minimum number of iterations.

It is according to another embodiment of the current invention to present a method of correcting the shimming elements of a magnetic resonance device by detecting irregularities in the magnetic field of the sample region through comparisons between the line shape of the response with the line shape of a reference standard.

Figure 3:
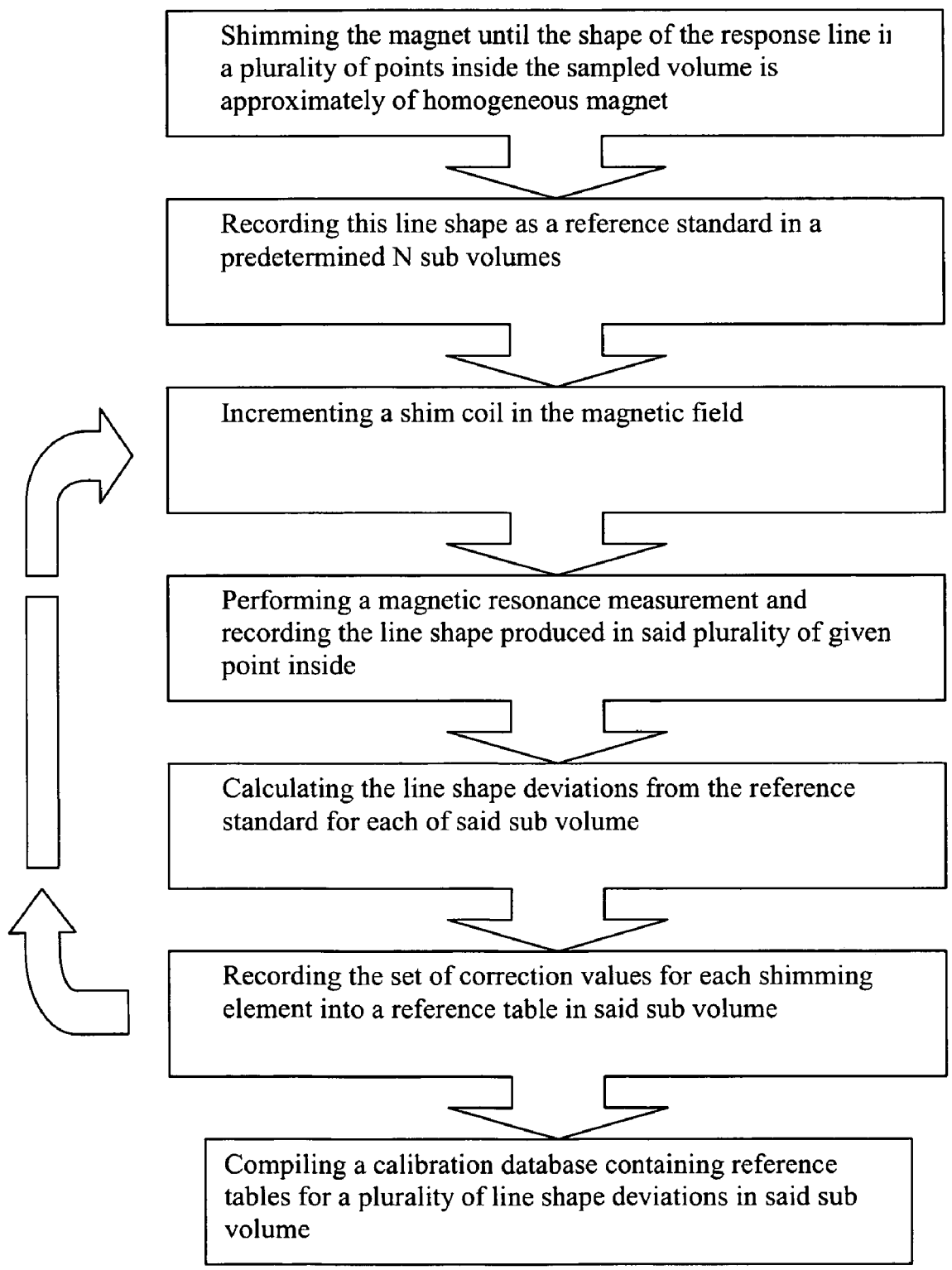
FIG. 3 schematically represents a calibration procedure of the minimum cycle magnetic resonance shimming system according to another embodiment of the present invention; and, FIG. 4 schematically represents the shimming procedure of the minimum cycle magnetic resonance shimming system according to another embodiment of the present invention.

It is according to another embodiment of the current invention to present a method of correcting the shimming elements of a magnetic resonance device by additionally including a calibration method for producing a set of correction values comprising applying a pulse of current to the first order gradient coils and measuring the line shape of a magnetic resonance measurement in N sub volumes, shimming the magnet until the shape of the response line is e.g., approximately Gaussian or combination of Gaussian in nature then recording this line shape as a reference standard for the $N^{th}$ sub volume. Then apply DC time current to the $1^{st}$ order shim coil and measure a set of correction values is then produced for a particular first order line shape deviation from the reference standard by making a small first order gradient in the magnetic field by increasing the direct current to the first order shim coils or any other means, performing a magnetic resonance measurement in the new field for N sub volume, recording the line shape produced in the non-uniform field and calculating the linear line shape deviation from the reference standard similarly, repeat the process for all $1^{st}$ order shim coils, then repeat the process for all second order and calculating second order deviation, then for third order and higher order deviations from the reference standard. The correction values of each shimming element for a given deviation are then recorded thereby producing a correction value for each shimming element to be applied in order to correct a given line shape deviation for each sub volume. Store the value in the correction database, associated with said line shape deviation for a given sub space. The calibration procedure is represented in FIG. 3.

Figure 4:
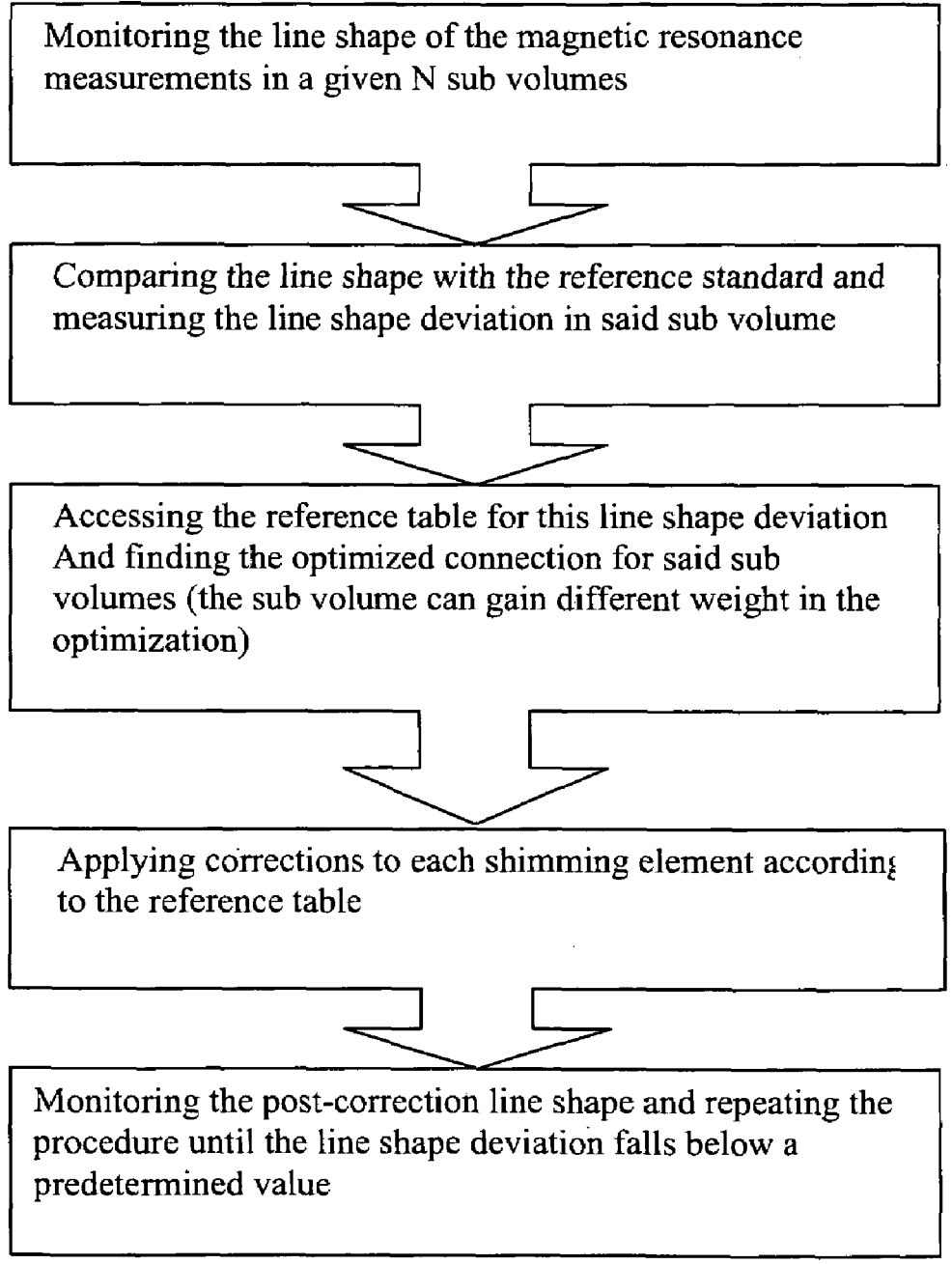

It is according to another embodiment of the current invention to present a method of correcting the shimming elements of a magnetic resonance device by automatically correcting the shimming elements by inputting into a correction database the correction values of each shimming element for each line shape deviation for each sub volume, optionally providing an automated correction program, measuring the line shape of the magnetic resonance measurements by applying a pulse of current to the first gradient coils for measuring the line shape of a magnetic resonance measurement in N sub volume, comparing the line shape of magnetic resonance measurements with the reference standard and calculating the line shape deviation of the magnetic resonance measurement then calculating the optimized correction value then applying corrections to each shimming element according to the correction values calculated, additional corrections are made to each shimming element according to the correction values, the procedure is repeated until the line shape deviation falls below a predetermined value thereby restoring uniformity of magnetic field following any variation, such as temperature change, effecting the magnetic field around the sample. This shimming procedure is represented in FIG. 4.

It is according to another embodiment of the current invention to present a method of correcting the shimming elements of a magnetic resonance device additionally comprising optimizing said correction currents to the shimming coils such that the total energy consumption is minimized.

It is according to another embodiment of the current invention to present a method of correcting the shimming elements of a magnetic resonance device by applying correction currents to shimming coils.

It is according to another embodiment of the current invention to present a method of correcting the shimming elements of a magnetic resonance device by applying correction potentials across the shimming coils.

It is according to another embodiment of the current invention to present a method of correcting the shimming elements of a magnetic resonance device by changing the shape of the shimming coils.

It is according to another embodiment of the current invention to present a method of correcting the shimming elements of a magnetic resonance device by changing the position of the shimming elements.

It is according to another embodiment of the current invention to present a method of correcting the shimming elements of a magnetic resonance device by introducing additional shimming elements.

It is according to another embodiment of the current invention to present a method of correcting the shimming elements of a magnetic resonance device by monitoring the line shape of magnetic resonance measurements at regular time intervals for the whole volume to one or more sub volumes.

It is according to another embodiment of the current invention to present a method of correcting the shimming elements of a magnetic resonance device by monitoring the line shape of magnetic resonance measurements following each measurement of the sample.

It is according to another embodiment of the current invention to present a method of correcting the shimming elements of a magnetic resonance device by monitoring the line shape of magnetic resonance measurements whenever the line shape deviation of the magnetic resonance measurements of the sample increase above a predetermined value.

It is according to another embodiment of the current invention to present a minimum cycle shimming system for a magnetic resonance device comprising, a magnetic circuit constructed from strong permanent magnets, an adjustable shimming mechanism, at least one gradient coil, at least one shim coil, a contained cavity into which a sample is introduced and measured and at least one magnetic resonance measurement probe. Said system additionally comprises a reference table of correction values, a reference standard magnetic resonance measurement line shape on whole volume, one or more sub-volume and a means, such as a CPU or any other processing means, of calculating the line shape deviation of a magnetic resonance measurement and applying corrections to each shimming element according to the reference table of correction values such that that the uniformity of the magnetic field around the sample is monitored and restored following any variation, such as temperature change, effecting the magnetic field around the sample.

It is according to another embodiment of the current invention to present a minimum cycle shimming system for a magnetic resonance device additionally comprising at least one sensor useful for measuring parameters selected from a group comprising temperature of components such as the magnetic assembly, sample, insulating layer or any other component; sample flow rate, pressure or any combination thereof.

It is according to another embodiment of the current invention to present a minimum cycle shimming system for a magnetic resonance device additionally comprising means for stopping the flow of samples into the device for a predetermined time for measuring said sample.

It is according to another embodiment of the current invention to present a minimum cycle shimming system for a magnetic resonance device wherein the adjustable shimming mechanism comprises shimming elements selected from active shimming coils, passive ferromagnetic pieces or any combination thereof.

It is according to another embodiment of the current invention to present a minimum cycle shimming system for a magnetic resonance device wherein the adjustable shimming mechanism comprises a plurality of sets of shim coils particularly adapted to correct first, second, third and higher order devation of the magnetic field from homogeneity It is according to another embodiment of the current invention to present a minimum cycle shimming system for a magnetic resonance device wherein at least one gradient coil is supplied by a DC power supply providing a constant current through the coil.

It is according to another embodiment of the current invention to present a minimum cycle shimming system for a magnetic resonance device wherein at least one gradient coil is supplied by a pulsing power supply which provides a pulse of current through the coil characterized by a line shape which varies over time.

It is according to another embodiment of the current invention to present a minimum cycle shimming system for a magnetic resonance device wherein at least one gradient coil is supplied by a power supply which supplies either DC current through the coil or a current pulse or a combination of the two.

It is according to another embodiment of the current invention to present a minimum cycle shimming system for a magnetic resonance device additionally comprising a means of varying the current supplied to the shimming coils.

It is according to another embodiment of the current invention to present a minimum cycle shimming system for a magnetic resonance device additionally comprising a means of increasing the current supplied to the shimming coils.

It is according to another embodiment of the current invention to present a minimum cycle shimming system for a magnetic resonance device additionally comprising a means of increasing the potential applied across the shimming coils.

It is according to another embodiment of the current invention to present a minimum cycle shimming system for a magnetic resonance device additionally comprising a means of altering the shape of the shimming coils.

It is according to another embodiment of the current invention to present a minimum cycle shimming system for a magnetic resonance device additionally comprising a means of changing the position of the shimming elements such as tracks, mechanical arms or any other means.

It is according to another embodiment of the current invention to present a minimum cycle shimming system for a magnetic resonance device additionally comprising a means of adding additional shimming elements to the system as required.

It is according to another embodiment of the current invention to present a minimum cycle shimming system for a magnetic resonance device wherein a pulse of current through at least one shimming coil provides the gradient in the vicinity of the sample used to produce the magnetic resonance measurement in sub volumes.

Reference is made now to FIG. 1, schematically presenting the minimum cycle magnetic resonance measurement unit. The magnetic poles, 1, produce an irregular magnetic field which is corrected by the shim coils, 2a-f. The sample passes through a pipe, 3a, surrounded by a gradient coil, 3b, which produces a magnetic gradient within the sample. The magnetic resonance measurement probe, 4, transmits an excitation signal and receives the response signal from the sample.

Figure 2:
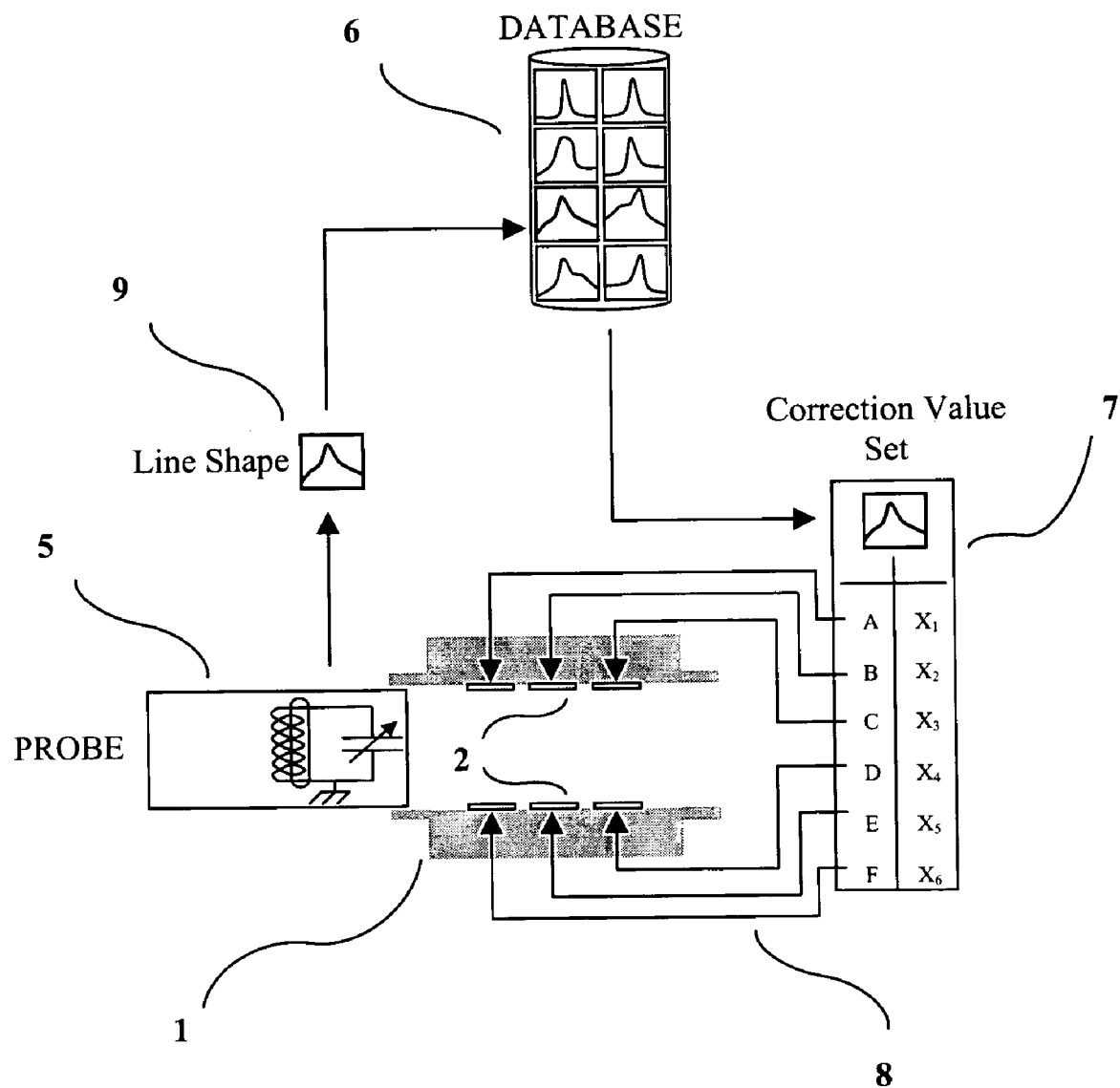
FIG. 2 schematically represents the minimum cycle magnetic resonance shimming system according to another embodiment of the present invention, here described for example for only one point, wherein any point may have a different database.

Reference is made now to FIG. 2, schematically presenting the minimum cycle magnetic resonance shimming system. The probe, 5, of a magnetic resonance measurement device, 1, measures a sample and produces a response signal with the line shape shown, 9, a CPU compares the line shape with the line shapes stored in the database, 6. The correction value set, 7, associated with the selected line shape is retrieved from the database. The shim coils, 2 are then corrected according to the correction values in the correction value set.

What is claimed is:

1. A magnetic resonance imaging device calibrated by shimming, comprising:
   i. a magnetic circuit constructed from strong permanent magnets;
   ii. an adjustable shimming mechanism;
   iii. at least one gradient coil (3b);
   iv. at least one shimming coil (2a-f);
   v. a contained cavity into which at least one sample is introduced and measured;
   vi. at least one magnetic resonance RF coil; and,
   vii. a plurality of a predetermined distinct N sub measurement volumes,
   viii. a processing means, wherein said processing means generates a correction table for adjusting said shimming coils by calculating a line shape deviation between a standard reference and a magnetic resonance measured sample at each of said N sub measurement volumes.

2. The magnetic resonance imaging device according to claim 1, additionally comprising at least one sensor useful for measuring parameters selected from a group comprising temperature, flow rate, pressure or a combination thereof.

3. The magnetic resonance imaging device according to claim 1, additionally comprising means for stopping the current flow for a predetermined time of measuring said sample.

4. The magnetic resonance imaging device according to claim 1, wherein the adjustable shimming mechanism comprises shimming elements selected from active shimming coils, passive ferromagnetic pieces or any combination thereof.

5. The magnetic resonance imaging device according to claim 1, wherein the adjustable shimming mechanism comprises a plurality of sets of shim coils particularly adapted to correct in-homogenous magnetic field.

6. The magnetic resonance imaging device according to claim 1, wherein at least one gradient coil is supplied by a DC power supply providing a constant current through the coil.

7. The magnetic resonance imaging device according to claim 1, wherein at least one gradient coil is supplied by a pulsing power supply which provides a pulse of current through the coil characterized by a line shape which varies over time.

8. The magnetic resonance imaging device according to claim 1, wherein at least one gradient coil is supplied by a power supply which supplies either DC current through the coil or a current pulse or a combination of the two.

9. The magnetic resonance imaging device according to claim 1, additionally comprising a means of varying the current supplied to the shimming coils.

10. The magnetic resonance imaging device according to claim 1, additionally comprising a means of varying the current applied across the shimming coils.

11. The magnetic resonance imaging device according to claim 1, additionally comprising a movable core, for altering the magnetic permeability of the shimming coils.

12. The magnetic resonance imaging device according to claim 1, additionally comprising any of means for altering the shape of the shimming coils, means for changing the position of any of said shimming elements, and means for varying the number of shimming elements in said system.

13. The magnetic resonance imaging device according to claim 1, adapted to measure in at least one sub volume of said predetermined plurality of N sub volumes.

14. A calibration method for enhancing the uniformity of the magnetic field of a magnetic resonance imaging (MRI) device within a sample measurement volume by shimming, the method comprising:
  i. creating a set of correction values for each shimming coil in a MRI device having an MRI magnet by:
    (a) measuring the line shape of a reference standard sample in N sub volumes within said measurement volume; and
    (b) recording this line shape as a calibration reference;
  ii. conducting a magnetic resonance measurement of a sample in at least one of said N sub volumes;
  iii. shimming the magnetic field of said MRI device by disposing a plurality of shimming elements proximate to said MRI magnet and iteratively adjusting the magnetic field of said shimming elements until a line shape of the measurement sample of said sub volume represents a substantially homogeneous magnetic field within said measurement sub volume; and
  iv. calculating and recording a shimming correction table used for changing said correction values of said shimming coils;
  wherein said calculating of said shimming correction table is functionally dependent on a deviation between said line shape of said standard sample and the line shape of the measurement sample of said sub volumes.

15. The method according to claim 14, further comprising applying variable timing current to gradient coils (3b).

16. The method according to claim 14, further comprising optimizing correction currents of said shimming coils to minimize electrical power consumption.

17. The method according to claim 14, further comprising the step of optimizing parameters of said shimming coils, said parameters selected from a group comprising coil geometry, coil composition, coil orientation and coil strength or any combination thereof.

* * * * *